US006496708B1

(12) United States Patent
Chan et al.

(10) Patent No.: US 6,496,708 B1
(45) Date of Patent: Dec. 17, 2002

(54) RADIO FREQUENCY COUPLER APPARATUS SUITABLE FOR USE IN A MULTI-BAND WIRELESS COMMUNICATION DEVICE

(75) Inventors: Yiu K. Chan, Woodinville, WA (US); Dale Schwent, Schaumburg, IL (US); Michael Landherr, Cary, IL (US); Armin Klomsdorf, Spring Grove, IL (US); Michael Hand, Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/396,384

(22) Filed: Sep. 15, 1999

(51) Int. Cl.$^7$ .................................................. H04B 1/38

(52) U.S. Cl. ...................... 455/553; 455/115; 455/127; 333/109; 330/126

(58) Field of Search ............................. 455/74, 78, 80, 455/81, 82, 93, 114, 115, 127, 129, 552, 553; 330/53, 124, 126, 286; 333/109–117; 343/702, 739, 749

(56) References Cited

U.S. PATENT DOCUMENTS

| 4,809,356 A | | 2/1989 | Peckham et al. ............. 455/86 |
| 5,006,821 A | | 4/1991 | Tam ............................ 333/116 |
| 5,363,071 A | | 11/1994 | Schwent et al. ............. 333/111 |
| 5,448,771 A | | 9/1995 | Klomsdorf ................... 455/126 |
| 5,698,819 A | * | 12/1997 | Brockett et al. ............. 174/52.1 |
| 5,732,330 A | | 3/1998 | Anderson et al. ............. 455/76 |
| 5,794,159 A | | 8/1998 | Portin ......................... 455/553 |
| 5,884,149 A | | 3/1999 | Jaakola ........................ 455/103 |
| 5,974,305 A | * | 10/1999 | Matero ...................... 455/180.1 |
| 6,216,012 B1 | * | 4/2001 | Jensen ......................... 455/426 |

FOREIGN PATENT DOCUMENTS

EP 0 878 917 A2 11/1998

OTHER PUBLICATIONS

"Cellular South Launches 1900 MHz TDMA Network in Jackson, Miss.", Nortel Networks web site, Jan. 20, 1999.
"Ericsson unveils plans for industry's first 'world phones' capable of offering unparalleled global roaming", Mobile Softline web page, Aug. 16, 1999, originally published by Ericsson $2^{nd}$ quarter, 1998.
Digital Market Forecasts Table of Contents, PR Guide web site (4 sheets), published Dec. 1996.
"Orange Roaming", Mobiles Co. web site (2 sheets), updated Apr. 22, 1999.
Bennett, G. "The New PCS Phones", TCP web site (3 sheets), updated May 21, 1998.

* cited by examiner

Primary Examiner—Lester G. Kincaid
Assistant Examiner—Ronald Ward
(74) Attorney, Agent, or Firm—Mark D. Partick; Shigeharu Furukawa

(57) ABSTRACT

A radio frequency (RF) coupler apparatus (312) suited for use in a multi-band wireless communication device (200), has a termination device (316) and couplers (314 and 315). Each of the couplers (314 and 315) has through-path coupling elements (318 and 320) and coupled-path coupling elements (319 and 321). Through-path coupling elements (318 and 320) pass a RF signal that is to be transmitted respective frequency bands (TX BAND 1, TX BAND 2) within which the device (200) operates. Coupled-path coupling elements (319 and 321) couple the RF signals passed by respective through-path coupling elements (318 and 320). The coupled-path coupling elements (319 and 321) and the termination device (316) are coupled in series, thereby permitting compatibilty with a RF power detector (313) that uses a single detection diode (322).

20 Claims, 9 Drawing Sheets

— PRIOR ART —

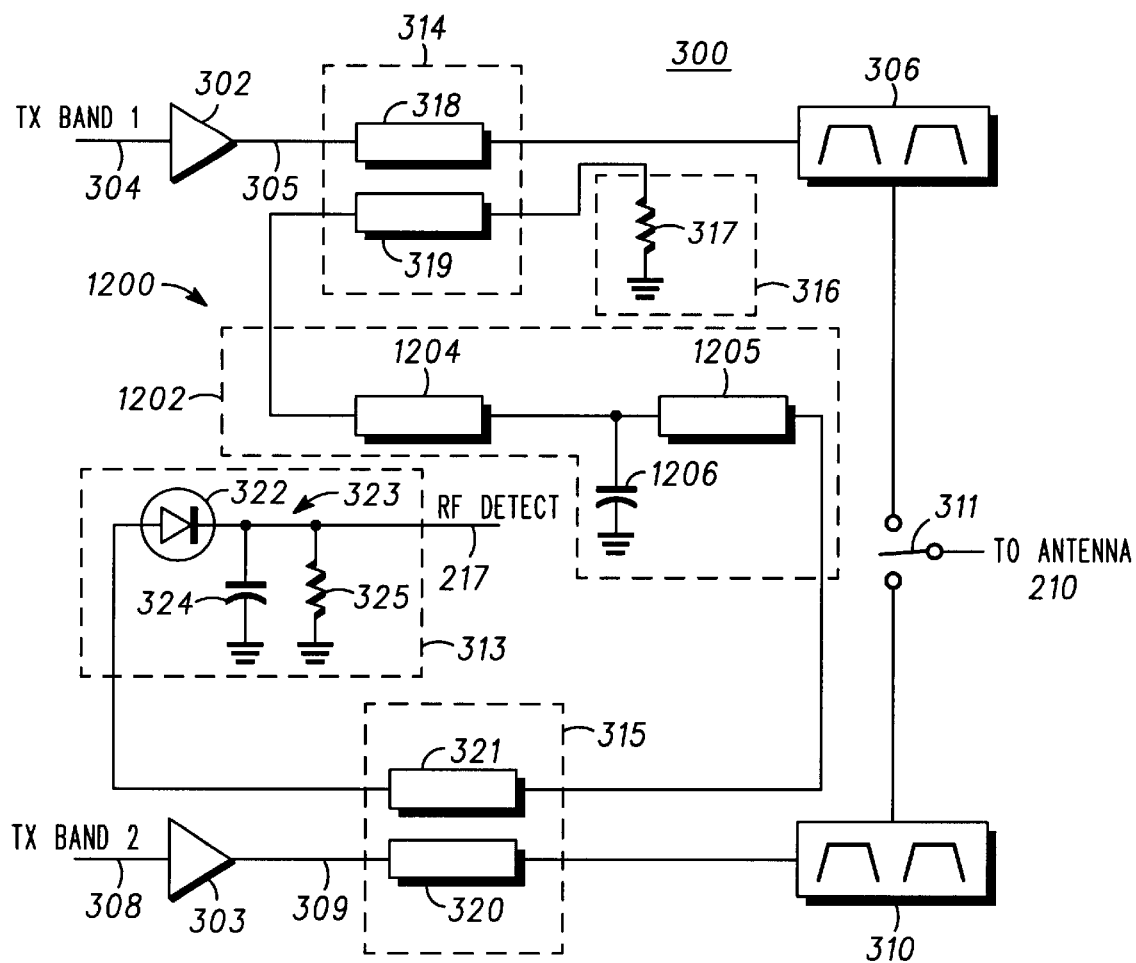
FIG.12
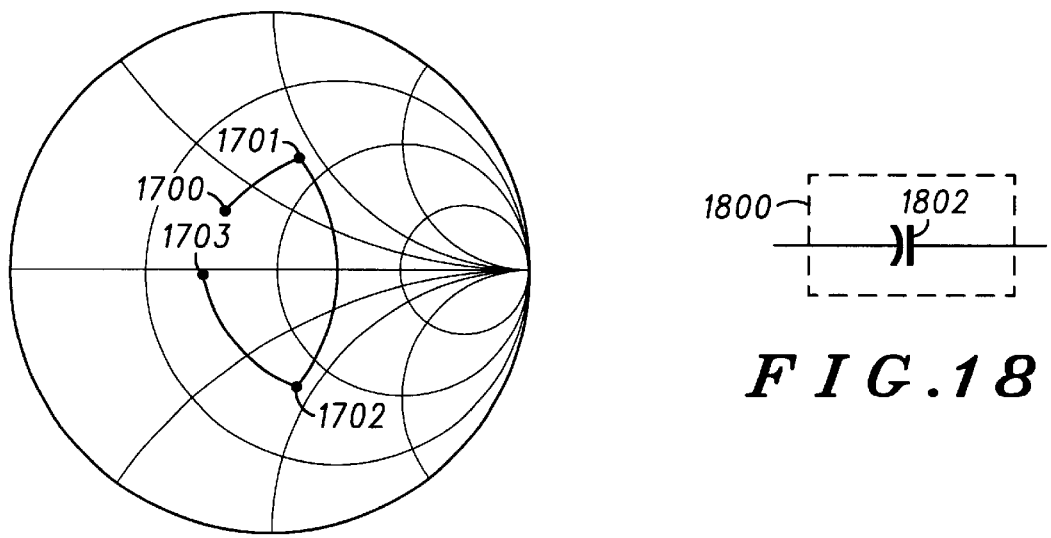
FIG.17
FIG.18

US 6,496,708 B1

RADIO FREQUENCY COUPLER APPARATUS SUITABLE FOR USE IN A MULTI-BAND WIRELESS COMMUNICATION DEVICE

FIELD OF THE INVENTION

The present invention relates generally to signal couplers, and more particularly to a radio frequency (RF) coupler apparatus suitable for use in a multi-band wireless communication device, such as a dual band wireless telephone.

BACKGROUND OF THE INVENTION

A dual band wireless telephone is capable of operating in two communication systems, each characterized by a different frequency band. One existing dual band wireless telephone operates in both the Global Standard for Mobile (GSM) digital system by transmitting RF signals in a frequency band from 890 MHz to 915 MHz ("GSM 900") and the GSM 1800 digital system by transmitting RF signals in a frequency band from 1710 MHz to 1785 MHz ("GSM 1800"). Another existing dual band wireless telephone operates in both the Advanced Mobile Phone Service (AMPS) analog system by transmitting RF signals in a frequency and from 824 MHz to 849 MHz ("AMPS 800") and the 1900 MHz Time Division Multiple Access (TDMA) IS-136 digital system by transmitting RF signals in a frequency band from 1850 MHz to 1910 MHz ("TDMA 1900" or "D-AMPS 1900").

Prior art transmitter circuitry 100 of a dual band wireless telephone is shown in FIG. 1. The transmitter circuitry 100 includes RF power amplifier 102 to amplify RF signals in a first frequency band TX BAND 1 for transmission at an antenna, and RF power amplifier 103 to amplify RF signals for transmission in a second frequency band TX BAND 2 at the antenna. To measure the power level of the transmitted RF signals, the transmitter circuitry 100 uses a RF coupler apparatus 104 with two separate transmission line coupling structures 106 and 107, which are coupled in parallel at a summing junction 108 via respective detection diodes 110 and 111 of a RF power detector 109. Each of the coupling structures 106 and 107 have a coupler (i.e., couplers 112 and 113) and a termination device (i.e., termination devices 114 and 115). The RF power detector 109 outputs a RF detect signal, which has an amplitude related to the amplitude of the RF signals output by RF power amplifier 102 or 103. The RF detect signal is used to control the power level at which the dual band wireless telephone transmits.

The RF coupler apparatus 104 requires that the RF power detector 109 include one detection diode per coupling structure. It can be appreciated that when the dual band wireless telephone is portable or hand-held, an important goal is to minimize component count. Modifying the RF power detector 109 by moving the summing junction 108 to the input of the RF power detector 109 (i.e., to the anode of detection diode 110) and removing the detection diode 111 would result in an unacceptable RF voltage loss at the input of the RF power detector 109 and a reduction in the sensitivity of the RF power detector 109. Therefore, what is needed is a RF coupler apparatus that is suitable for use in a multi-band wireless communication device and reduces duplication of components in an RF power detector.

BRIEF DESCRIPTION OF THE DRAWINGS

FIG. 12 is a schematic diagram illustrating an alternate embodiment of the RF coupler apparatus of FIG. 3 employing a matching circuit;

FIG. 17 is a Smith chart diagram illustrating impedance transformation performed by the matching circuit of the RF coupler apparatus of FIG. 12 when coupling signals transmitted in the frequency band associated with TDMA 1900;

FIG. 18 is a schematic diagram illustrating an alternate embodiment of the matching circuit of FIG. 12 employing a single circuit element;

DETAILED DESCRIPTION OF THE PREFERRED EMBODIMENTS

A radio frequency (RF) coupler apparatus comprises a single coupling structure with two couplers and a termination device. Each of the couplers has a through-path coupling element and a coupled-path coupling element. The through-path coupling element of the first coupler is operable to pass a signal having a frequency in a first frequency band. The through-path coupling element of the second coupler is operable to pass a signal having a frequency in a second frequency band. The coupled-path coupling element of each of the two couplers is operable to couple the signal passed by its respective through-path coupling element. One end of the coupled-path coupling element of the first coupler is coupled in series with the termination device. The other end of the coupled-path coupling element of the first coupler is coupled in series with the coupled-path coupling element of the second coupler. By coupling the couplers in series, the RF coupler apparatus is compatible with a RF power detector that uses a single detection diode.

Figure 1:
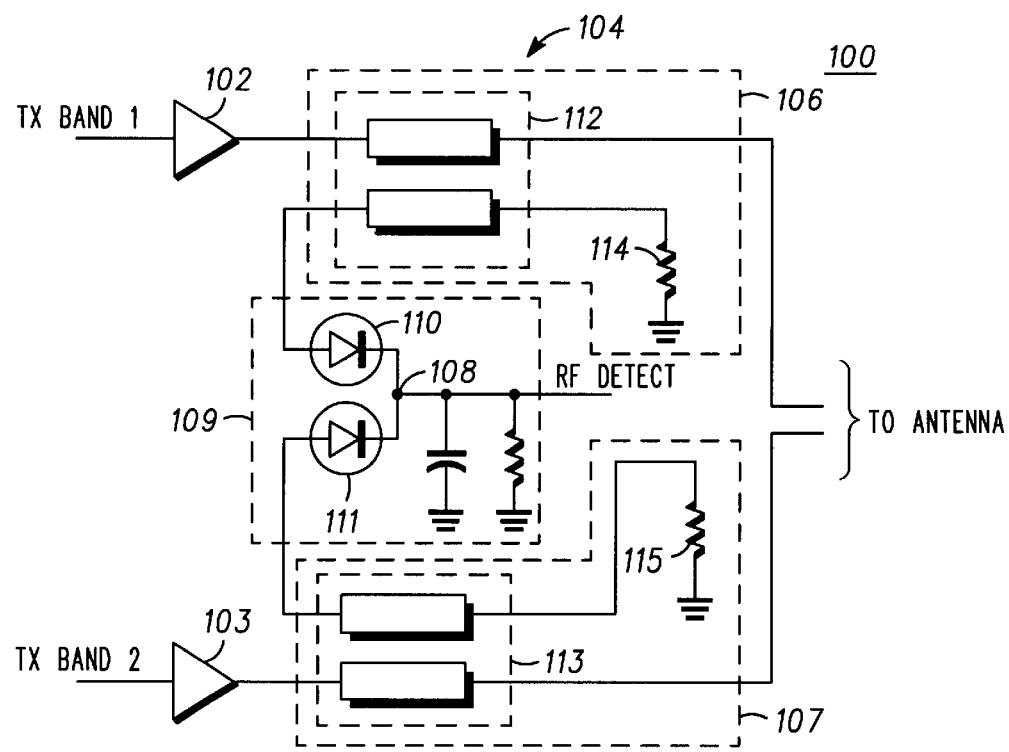
FIG. 1 is a schematic diagram illustrating prior art transmitter circuitry for a dual band wireless telephone, the transmitter circuitry employing a RF coupler apparatus comprised of two separate coupling structures joined in parallel.
Figure 2:
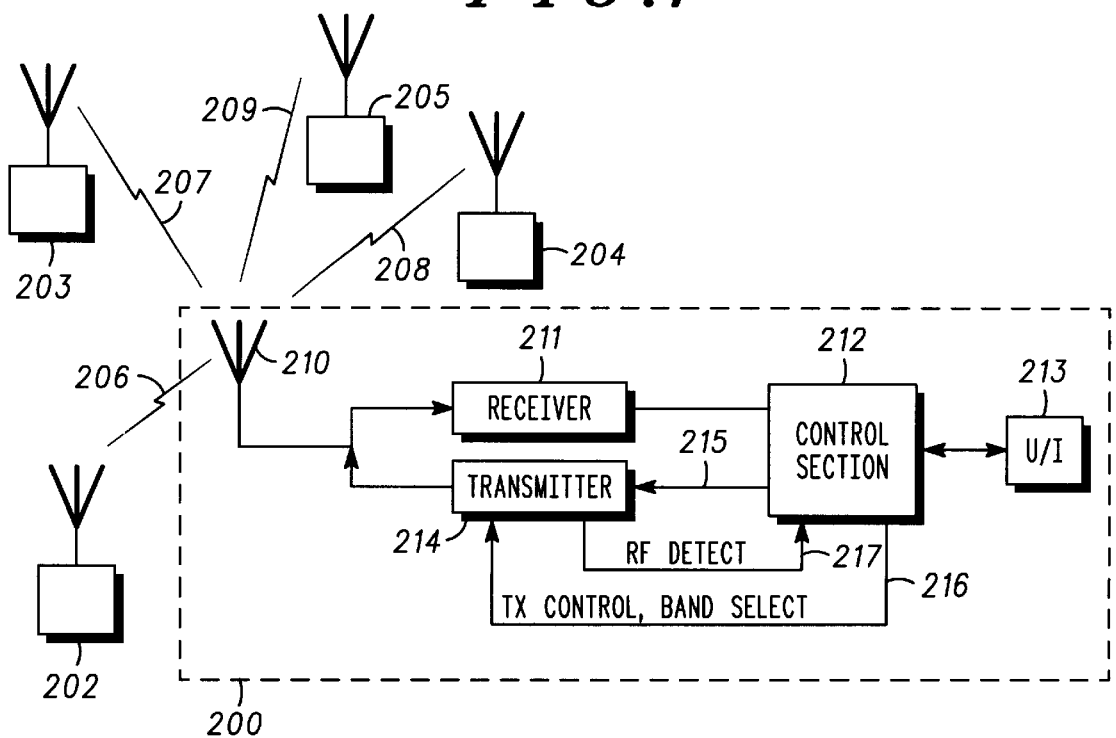
FIG. 2 is a block diagram illustrating a multi-band wireless communication device operable in multiple communication systems.

A multi-band wireless communication device 200 is shown in FIG. 2. The communication device 200 is operable in multiple communication systems of which remote communication devices 202–205 are representative. In the illustrated embodiment, the communication device 200 is a AMPS 800/TDMA 1900 dual band wireless telephone and remote communication devices 202 and 203 are AMPS 800 and TDMA 1900 wireless base stations, respectively. Although shown as a AMPS 800/TDMA 1900 dual band wireless telephone, the communication device 200 may alternatively be another dual band wireless telephone, such as, for example, a GSM 900/GSM 1800 dual band wireless telephone; a TDMA dual band wireless telephone that operates in both the TDMA 1900 system and a 800 MHz TDMA IS-136 digital system ("TDMA 800" or "D-AMPS 800"); a dual band wireless telephone that operates in AMPS 800 and in a 1900 MHz Code Division Multiple Access (CDMA) IS-95 digital system ("CDMA 1900") or a CDMA dual band wireless telephone that operates in CDMA 1900 and a 800 MHz CDMA IS-95 digital system. In the event that the communication device 200 is one of these alternate dual band wireless telephones, remote communication devices 202 and 203 would be the corresponding wireless base stations.

The communication device 200, as a dual band wireless telephone, communicates with any one of remote communication devices 202 and 203 via RF signals on respective communication links 206 and 207. The communication device 200 includes an antenna 210, a receiver 211 coupled to the antenna 210, a control section 212 coupled to the receiver 211, a user interface 213 coupled to the control section 212 and a transmitter 214 coupled to the control section 212 and the antenna 210. The receiver 211 receives RF signals from communication link 206 or 207 through the antenna 210 and demodulates the RF signals. Demodulated information from the RF signals, which includes control information and can include message or voice information, is provided by the receiver 211 to the control section 212. The control section 212 controls the user interface 213 to output audible speech derived from the voice information and/or data received from message information. Data and speech input into the user interface 213 is formatted by the control section 212 and further coupled to the transmitter 214 via connection 215. The transmitter 214, which employs separate transmit paths for each frequency band and selects the desired transmit path under control of signal BAND SELECT sent by the control section 212 on connection 216, modulates the formatted data and speech signals and amplifies the modulated signals for transmission in the desired frequency band. The transmitter 214 amplifies the modulated signals to a power level set by signal TX CONTROL sent by the control section 212 on connection 216. The amplified signals are output by the transmitter 214 to the antenna 210 for emission as the RF signals on communication link 206 or 207. The power level of the amplified signals output to the antenna 210 is detected by the transmitter 214, which sends a signal RF DETECT representative of the actual output power level to the control section 212 via connection 217. The control section 212 adjusts the signal TX CONTROL to minimize differences between the desired output power level of the transmitter 214 and the actual output power level represented by the signal RF DETECT. The communication device 200 employs one or more printed circuit boards (not shown) upon which electrical circuits making up the receiver 211, the control section 212, the user interface 213 and the transmitter 214 are formed.

Although described as a dual band wireless telephone, the communication device 200 may alternatively be a wireless telephone that operates in more than two bands, such as a tri-band wireless telephone that operates in GSM 900, GSM 1800 and a 1900 MHz GSM digital system ("GSM 1900"); or a quad-band wireless telephone that operates in GSM 900, GSM 1800, D-AMPS 800 and D-AMPS 1900. In the event that the communication device 200 is a tri-band wireless telephone, remote communication devices 202 and 203 as well as an additional remote communication device 204 associated with communication link 208 would be the corresponding wireless base stations. In the event that the communication device 200 is the quad-band wireless telephone, remote communication devices 202–204 as well as an additional remote communication device 205 associated with communication link 209 would be the corresponding wireless base stations.

Figure 3:
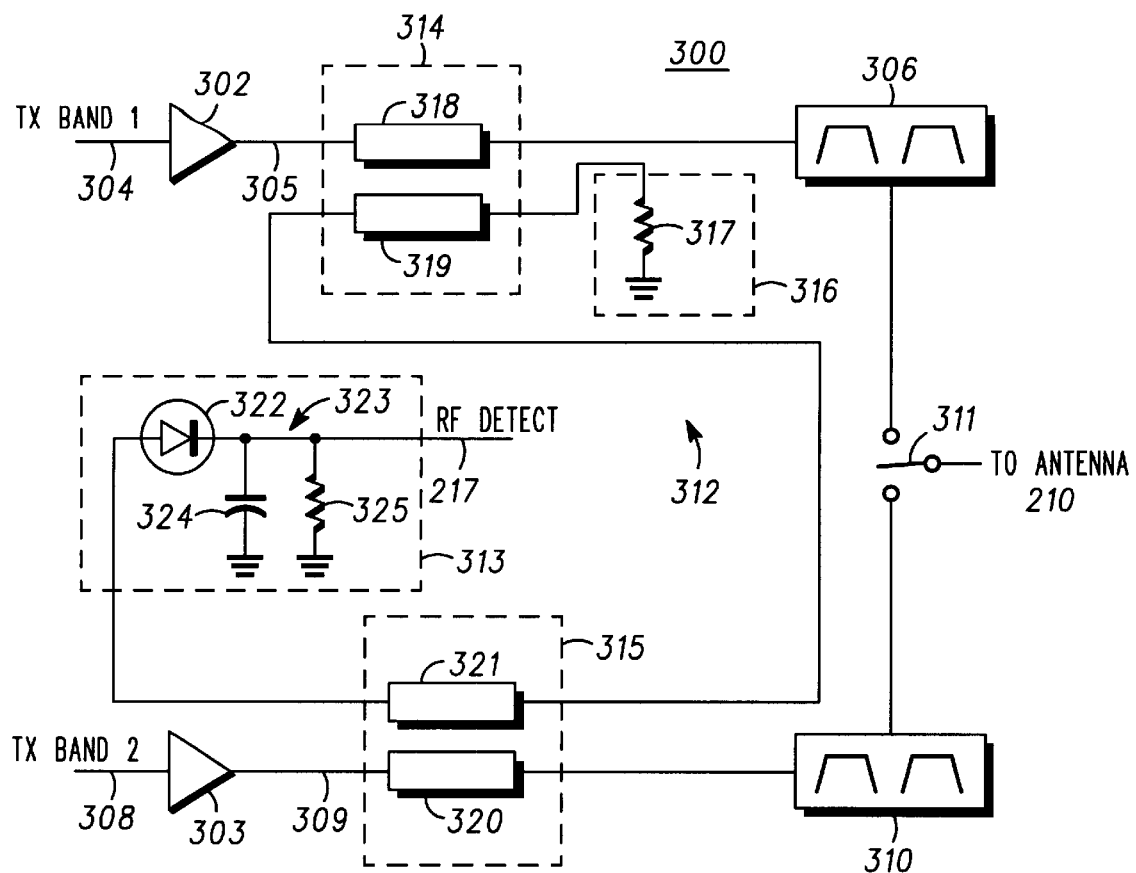
FIG. 3 is a schematic diagram illustrating transmitter circuitry of the communication device of FIG. 2, the communication device being a dual band wireless telephone, the transmitter circuitry employing a RF coupler apparatus comprised of a single coupling structure having two couplers and a termination device, all serially joined.

Transmitter circuitry 300 of the transmitter 214 is shown in FIG. 3 to have two transmit paths, each employing a RF power amplifier. RF power amplifier 302 amplifies signals for transmission in frequency band TX BAND 1 and RF power amplifier 303 amplifies signals for transmission in frequency band TX BAND 2. An input signal modulated for transmission in frequency band TX BAND 1 on connection 304 is amplified by RF power amplifier 302 to produce an amplified RF output signal on connection 305, which defines the output path of RF power amplifier 302. The transmitter circuitry 300 includes a duplexer 306 coupled in the output path of RF power amplifier 302 to perform RF isolation. An input signal modulated for transmission in frequency band TX BAND 2 on connection 308 is amplified by RF power amplifier 303 to produce an amplified RF output signal on connection 309, which defines the output path of RF power amplifier 303. The transmitter circuitry 300 includes a duplexer 310 coupled in the output path of RF power amplifier 303 to perform RF isolation. The transmitter circuitry 300 includes a switch 311 under control of the signal BAND SELECT of FIG. 2 to connect the output path of RF power amplifier 302 to the antenna 210 when the communication device 200 is transmitting in frequency band TX BAND 1 and, alternately, to connect the output path of RF power amplifier 303 to the antenna 210 when the communication device 200 is transmitting in frequency band TX BAND 2. The switch is preferably a single-pole double-throw switch but may be any other device that disconnects the output path of RF power amplifier 303 from the antenna 210 when the communication device 200 is transmitting in frequency band TX BAND 1 and disconnects the output path of RF power amplifier 302 from the antenna 210 when the communication device 200 is transmitting in frequency band TX BAND 2.

The transmitter circuitry 300 includes a RF coupler apparatus 312 and a RF power detector 313 coupled to the RF coupler apparatus 312. Unlike the RF coupler apparatus of the prior art, the RF coupler apparatus 312 has a single coupling structure with two couplers 314 and 315 and a termination device 316, all serially coupled. Coupler 314 is coupled in the output path of RF power amplifier 302. Coupler 314 has through-path coupling element 318 and coupled-path coupling element 319. Through-path coupling element 318 has two ports coupled in-line with connection 305. Coupled-path coupling element 319 is positioned in close physical proximity to through-path coupling element 318. Coupled-path coupling element 319 has an isolated port coupled in series directly to the termination device 316 and a coupled port coupled in series directly to coupler 315. Coupler 315 is coupled in the output path of RF power amplifier 303. Coupler 315 has through-path coupling element 320 and coupled-path coupling element 321. Through-path coupling element 320 has two ports coupled in-line with connection 309. Coupled-path coupling element 321 is positioned in close physical proximity to through-path coupling element 320. Coupled-path coupling element 321 has an isolated port coupled in series directly to coupled-path coupling element 319 of coupler 314 and a coupled port coupled in series directly to the RF power detector 313. The termination device 316 includes a resistor 317 having one end coupled to the isolated port of coupled-path coupling element 319 and the other end coupled to electrical ground.

The RF power detector 313 comprises a single detection diode 322 and a R-C network 323. The anode of the detection diode 322, which defines the input of the RF power detector 313, is coupled in series directly to the coupled port of coupled-path coupling element 319 of coupler 314. The cathode of the detection diode 322 is coupled in series directly to the R-C network 323, which comprises capacitor 324 and resistor 325 coupled in parallel. The output of the R-C network 323 forms the output of the RF power detector 313, which is coupled to the control section of FIG. 2 via connection 217.

During operation of RF power amplifier 302, through-path coupling element 318 of coupler 314 passes the amplified RF signal output by RF power amplifier 302 towards the antenna 210 as forward power. Portions of the amplified RF signal are reflected back to through-path coupling element 318 as reverse power. Coupled-path coupling element 319 of coupler 314 couples forward power present at through-path coupling element 318 to the coupled port of coupled-path coupling element 319, and couples reverse power present at through-path coupling element 318 to the isolated port of coupled-path coupling element 319. The resistor 317 of the termination device 316, which is selected to have an impedance to match the impedance of coupled-path coupling element 319 at its isolated port, eliminates the reverse power. The forward power at the isolated port of coupled-path coupling element 319 is coupled through coupled-path coupling element 321 of coupler 315 to detection diode 322, which together with capacitor 324 half-wave rectifies the forward power to generate a DC voltage proportional to the amplitude of the amplified RF signal output by RF power amplifier 302. The DC voltage is stored on capacitor 324 and coupled by resistor 325 to connection 217 as signal RF DETECT.

During operation of RF power amplifier 303, through-path coupling element 320 of coupler 315 passes the amplified RF signal output by RF power amplifier 303 towards the antenna 210 as forward power, and receives reflected portions of the amplified RF signal as reverse power. Coupled-path coupling element 321 of coupler 315 couples forward power present at through-path coupling element 320 to the coupled port of coupled-path coupling element 321, and couples reverse power present at through-path coupling element 320 to the isolated port of coupled-path coupling element 321. The isolated port of coupled-path coupling element 321 is terminated by coupled-path coupling element 319 and the resistor 317 of the termination device 316 to eliminate the reverse power at the isolated port of coupled-path coupling element 321. The forward power at the isolated port of coupled-path coupling element 321 is coupled to detection diode 322, which together with capacitor 324 half-wave rectifies the forward power to generate a DC voltage proportional to the amplitude of the amplified RF signal output by RF power amplifier 303. The DC voltage is stored on capacitor 324 and coupled by resistor 325 to connection 217 as signal RF DETECT.

RF coupler apparatus 312 shown in FIG. 3 is best suited for use when the impedance of couplers 314 and 315 is the same as that of the termination device 316. Coupling elements 318 and 319 of coupler 314 and coupling elements 320 and 321 of coupler 315 are preferably edge-coupled striplines. Assuming that frequency band TX BAND 1 is the lower of the two bands, such as the band associated with AMPS 800, and frequency band TX BAND 2 is the higher of the two bands, such as such as the band associated with TDMA 1900, exemplary values for the RF coupler apparatus 312 are:

For coupler 314,
each stripline of coupling elements 318 and 319 has a length of 500 mils, a width of 7.5 mils, an impedance of 50 ohms and a horizontal separation of 5 mils from the other stripline;

For coupler 315,
each stripline of coupling elements 320 and 321 has a length of 300 mils, a width of 7.5 mils, an impedance of 50 ohms and a horizontal separation of 5 mils from the other stripline; and For termination device 316,
resistor 317 has an impedance of 50 ohms.

Figure 4:
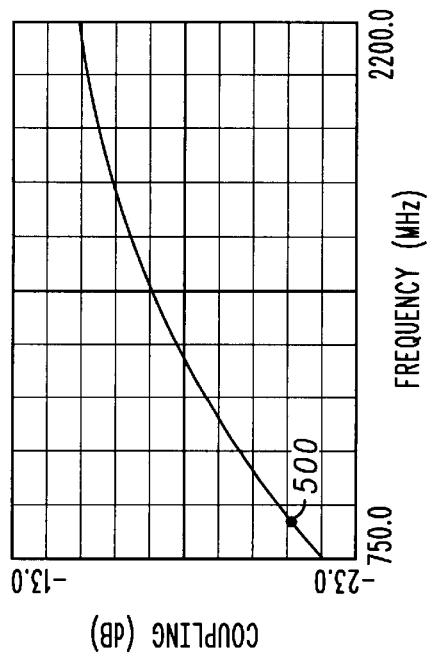
FIG. 4 is a graph illustrating isolation versus frequency for a first embodiment of the RF coupler apparatus of FIG. 3, the first embodiment of the RF coupler apparatus of FIG. 3 coupling signals transmitted in a frequency band associated with AMPS 800.
Figure 5:
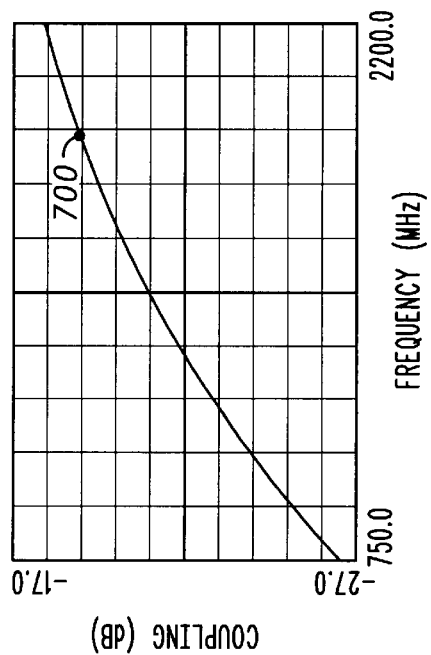
FIG. 5 is a graph illustrating coupling versus frequency for the first embodiment of the RF coupler apparatus of FIG. 3, the first embodiment of the RF coupler apparatus of FIG. 3 coupling signals transmitted in the frequency band associated with AMPS 800.
Figure 6:
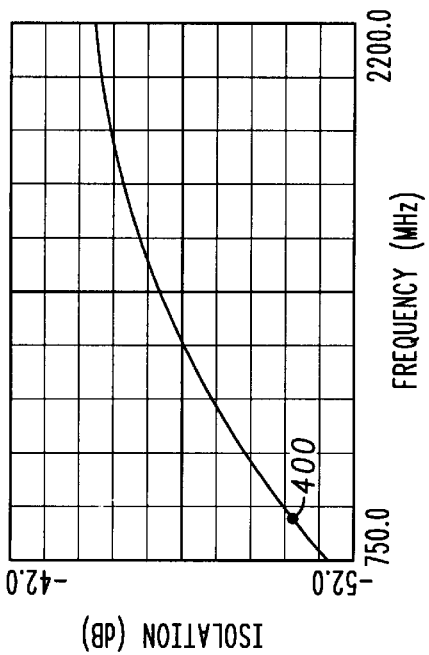
FIG. 6 is a graph illustrating isolation versus frequency for the first embodiment of the RF coupler apparatus of FIG. 3, the first embodiment of the RF coupler apparatus of FIG. 3 coupling signals transmitted in a frequency band associated with TDMA 1900.
Figure 7:
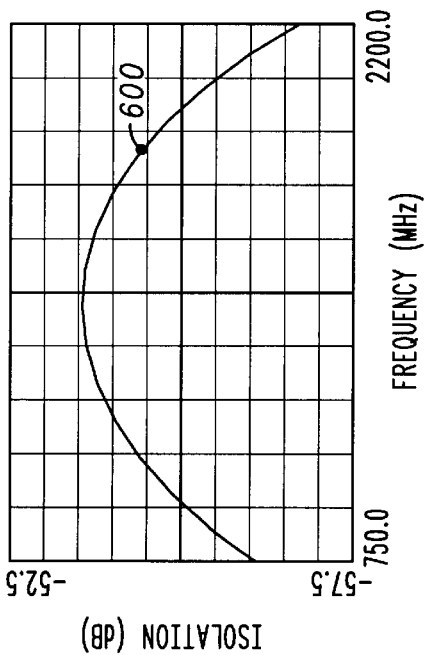
FIG. 7 is a graph illustrating coupling versus frequency for the first embodiment of the RF coupler apparatus of FIG. 3, the first embodiment of the RF coupler apparatus of FIG. 3 coupling signals transmitted in the frequency band associated with TDMA 1900.

As is well known in the art, the effectiveness of an RF coupler apparatus is measured by its directivity. Directivity, which may generally defined be as a coupler's ability to separate forward and reverse power, can be measured by subtracting the coupling of the RF coupler apparatus from its isolation. In this context, coupling may be defined as a coupler's ability to transfer a desired amount of power from a through-path coupling element to a coupled-path coupling element, and isolation may be defined as a coupler's ability to prevent reverse power from entering the coupled port of the coupled-path coupling element. Using the exemplary values given for couplers 314 and 315 and termination device 316, RF coupler apparatus 312 operates in the following manner. When coupling RF signals transmitted in the lower band for AMPS 800, RF coupler apparatus 312 exhibits isolation of about −50 dB, as shown by point 400 in FIG. 4, and coupling of about −21 dB, as shown by point 500 in FIG. 5, to yield a directivity of about −29 dB. When coupling RF signals transmitted in the higher band for TDMA 1900, RF coupler apparatus 312 exhibits isolation of about −54 dB, as shown by point 600 in FIG. 6, and coupling of about −19 dB, as shown by point 700 in FIG. 7, to yield a directivity of about −35 dB. These directivities of −29 dB and −35 dB can be quantified as excellent.

When portable or hand-held, the communication device 200 uses, where possible, minimally dimensioned components to achieve a constrained form factor. In this regard, each of the couplers 314 and 315 preferably use broadside-coupled microstriplines, which provide a more compact structure than the edge-coupled striplines described above. Examples of broadside-coupled microstripline coupler structures are shown and described in U.S. Pat. No. 5,448,771 to Klomsdorf et al., entitled "Embedded Tranmission Line Coupler For Radio Frequency Signal Amplifiers," issued on Sep. 5, 1995 and assigned to Motorola, Inc., the assignee of the present application. In operation, an embedded broadside-coupled microstripline coupler has a complex impedance (i.e., impedances having a real part and an imaginary part) and generally must be terminated by a termination device having a complex impedance.

Consider the following example of using an embedded broadside-coupled microstripline coupler structure for each of couplers 314 and 315 of RF coupling apparatus 312. Assuming that frequency band TX BAND 1 is the lower of the two bands, such as the band associated with AMPS 800, and frequency band TX BAND 2 is the higher of the two bands, such as the band associated with TDMA 1900, exemplary values for RF coupler apparatus 312 are:

For coupler 314,
a) microstripline of coupling element 318 is linear-shaped with a length of 300 mils and a width of 30 mils,
b) microstripline of coupling element 319 is "s"-shaped with an effective length of 310 mils fit to a length of 300 mils and a width of 10 mils and, and
c) microstriplines of coupling elements 318 and 319 are spaced apart vertically by 9 mils;

For coupler 315,
a) microstripline of coupling element 320 is linear-shaped with a length of 120 mils and a width of 30 mils,
b) microstripline of coupling element 321 is "s"-shaped with an effective length of 130 mils fit to a length 120 mils and a width of 10 mils, and
c) microstriplines of coupling elements 320 and 321 are spaced apart vertically by 9 mils; and For termination device 316, the resistor 317 has an impedance of 28 ohms.

With a termination impedance of 28 ohms at termination device 316, the impedance at the coupled port of coupled-path coupling element 319 is about 28+j7 when coupling RF signals transmitted in the lower band for AMPS 800, and the impedance at the isolated port of coupled-path coupling element 321 is about 31+j16 when coupling RF signals transmitted in the higher band for TDMA 1900.

Figure 8:
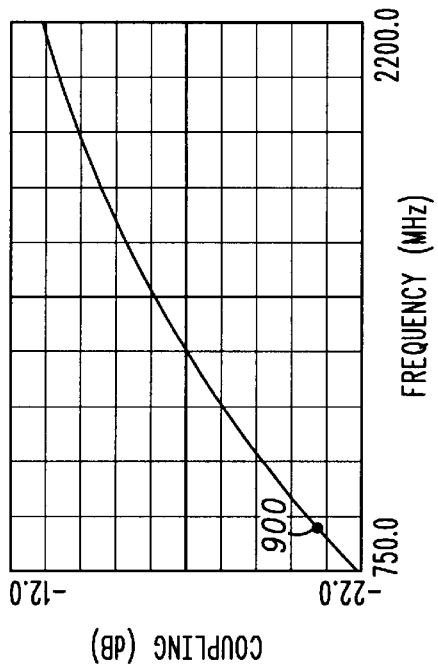
FIG. 8 is a graph illustrating isolation versus frequency for a second embodiment of the RF coupler apparatus of FIG. 3, the second embodiment of the RF coupler apparatus of FIG. 3 coupling signals transmitted in the frequency band associated with AMPS 800.
Figure 9:
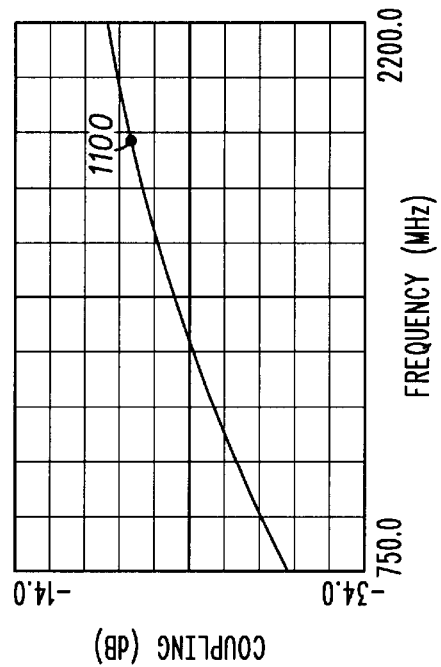
FIG. 9 is a graph illustrating coupling versus frequency for the second embodiment of the RF coupler apparatus of FIG. 3, the second embodiment of the RF coupler apparatus of FIG. 3 coupling signals transmitted in the frequency band associated with AMPS 800.
Figure 10:
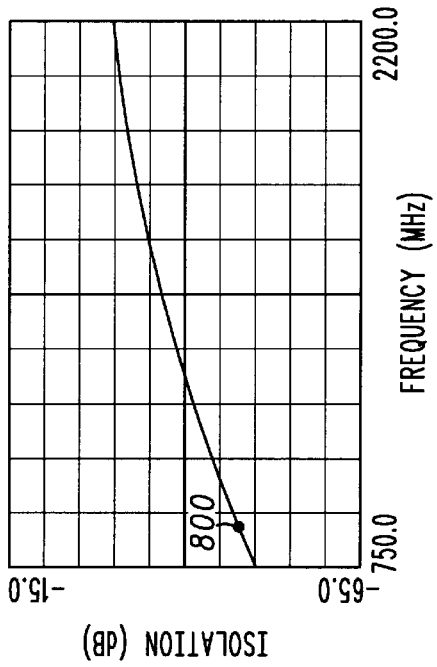
FIG. 10 is a graph illustrating isolation versus frequency for the second embodiment of the RF coupler apparatus of FIG. 3, the second embodiment of the RF coupler apparatus of FIG. 3 coupling signals transmitted in the frequency band associated with TDMA 1900.
Figure 11:
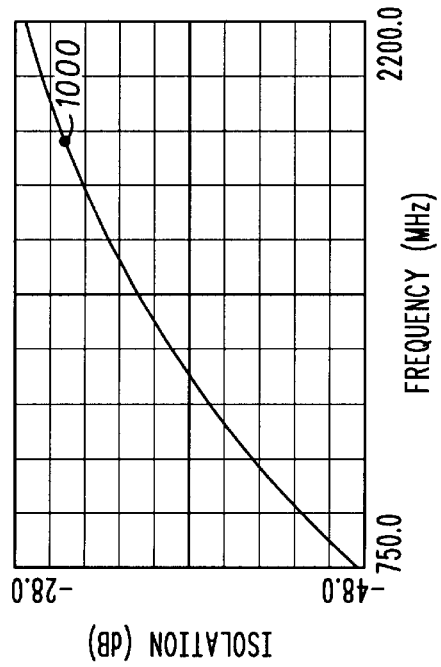
FIG. 11 is a graph illustrating coupling versus frequency for the second embodiment of the RF coupler apparatus of FIG. 3, the second embodiment of the RF coupler apparatus of FIG. 3 coupling signals transmitted in the frequency band associated with TDMA 1900.

Using the exemplary values given for the embedded broadside-coupled microstripline coupler structure implemented by couplers 314 and 315 and termination device 316, RF coupler apparatus 312 operates in the following manner. When coupling RF signals transmitted in the lower band for AMPS 800, RF coupler apparatus 312 exhibits isolation of about −47 dB, as shown by point 800 in FIG. 8, and coupling of about −21 dB, as shown by point 900 in FIG. 9, to yield directivity of about −26 dB. When coupling RF signals transmitted in the higher band for TDMA 1900, RF coupler apparatus 312 exhibits isolation of about −32 dB, as shown by point 1000 in FIG. 10, and coupling of about −21 dB, as shown by point 1100 in FIG. 11, to yield a directivity of about −11 dB. When coupling RF signals transmitted in the higher band for TDMA 1900, the directivity of the embodiment of this example of RF coupler apparatus 312 is considerably less than the directivity of the embodiment of the previous example of RF coupler apparatus 312. This low directivity when coupling RF signals transmitted in the higher band for TDMA 1900 can be attributed to failure of RF coupler apparatus 312 to terminate the isolated port of through-path coupling element 321 with the proper impedance.

To enhance directivity, an alternate preferred RF coupler apparatus 1200 shown in FIG. 12 may be used. RF coupler apparatus 1200 employs the general structure of RF coupler apparatus 312 but also includes a matching circuit 1202 coupled in series between couplers 314 and 315. The matching circuit 1202 employs transmission lines 1204 and 1205 and a shunt capacitor 1206. Transmission line 1204 has one port coupled to the coupled port of coupled-path coupling element 319 of coupler 314 and another port coupled to transmission line 1205. Transmission line 1205 has one port coupled to transmission line 1204 and another port coupled to the isolated port of coupled-path coupling element 321 of coupler 315. Shunt capacitor 1206 has one terminal coupled between the inter-coupled ports of transmission lines 1204 and 1205 and electrical ground.

The matching circuit 1202, operates as an impedance transformation device. During coupling of RF signals transmitted in frequency band TX BAND 2, the matching circuit 1202 provides the proper termination impedance at the isolated port of through-path coupling element 321. During coupling of RF signals transmitted in frequency band TX BAND 1, the matching circuit 1202 operates as a low loss transmission line that has a negligible effect on power transfer to the RF power detector 313. Assuming that frequency band TX BAND 1 is the lower of the two bands, such as the band associated with AMPS 800, and frequency band TX BAND 2 is the higher of the two bands, such as the band associated with TDMA 1900, exemplary values for the matching circuit 1202 are as follows: transmission line 1204 has a length of 200 mils, a width of 5 mils and an impedance of 100 ohms; transmission line 1205 has a length of 300 mils, a width of 5 mils and an impedance of 100 ohms; and capacitor 1206 is 2.2 pF. To minimize component count, transmission lines 1204 and 1205 are preferably metal strips embedded in a printed circuit board of the communication device 200, which may be composed of FR-4 fiberglass material. Capacitor 1206 is preferably a discrete component that is mounted on the surface of the printed circuit board.

Figure 13:
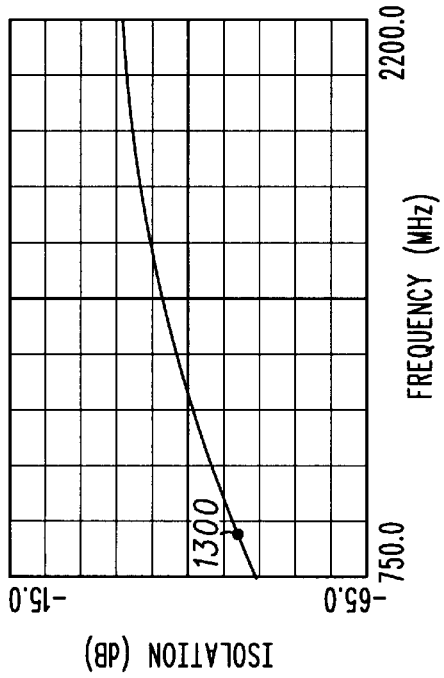
FIG. 13 is a graph illustrating isolation versus frequency for the RF coupler apparatus of FIG. 12 when coupling signals transmitted in the frequency band associated with AMPS 800.
Figure 14:
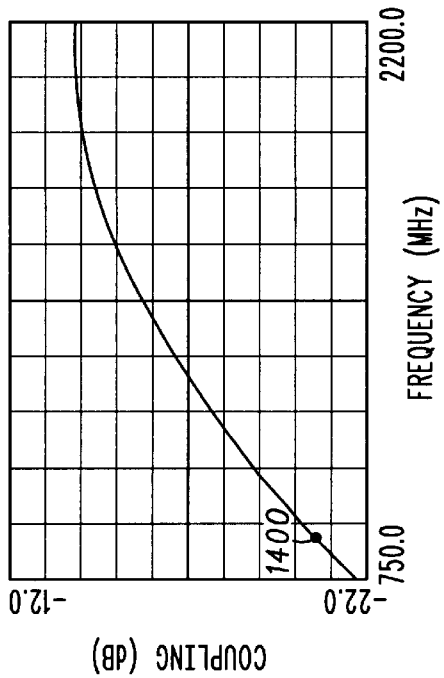
FIG. 14 is a graph illustrating coupling versus frequency for the RF coupler apparatus of FIG. 12 when coupling signals transmitted in the frequency band associated with AMPS 800.
Figure 15:
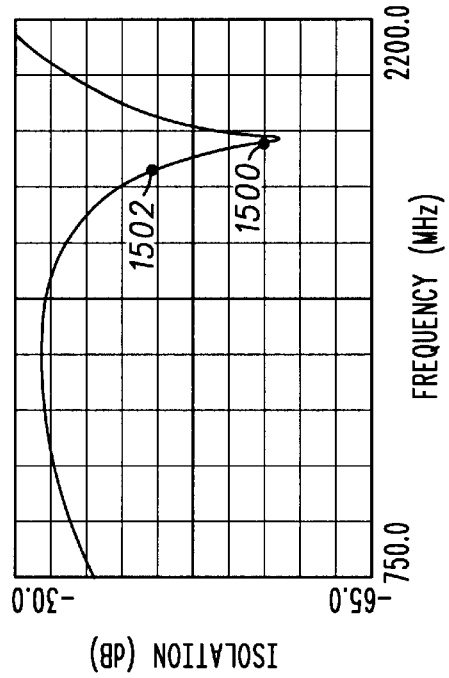
FIG. 15 is a graph illustrating isolation versus frequency for the RF coupler apparatus of FIG. 12 when coupling signals transmitted in the frequency band associated with TDMA 1900.
Figure 16:
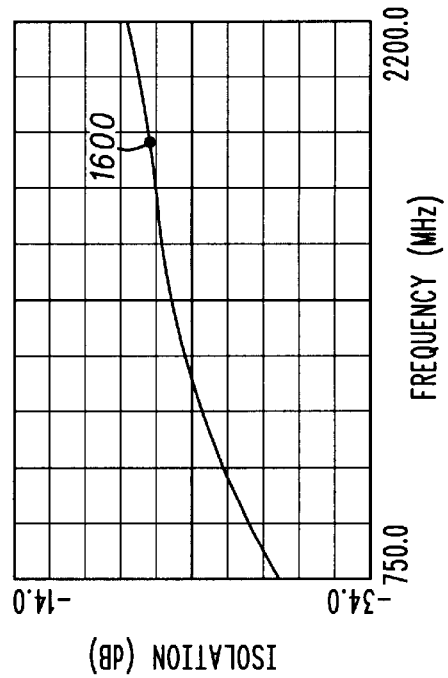
FIG. 16 is a graph illustrating coupling versus frequency for the RF coupler apparatus of FIG. 12 when coupling signals transmitted in the frequency band associated with TDMA 1900.

Using the exemplary values for the matching circuit 1202 and the exemplary values for couplers 314 and 315 and the termination device 316 described above in association with FIGS. 8–11, RF coupler apparatus 1200 operates in the following manner. When coupling RF signals transmitted in the lower band for AMPS 800, RF coupler apparatus 1200 exhibits isolation of about −47 dB, as shown by point 1300 in FIG. 13, and coupling of about −21 dB, as shown by point 1400 in FIG. 14, to yield directivity of about −26 dB. When coupling RF signals transmitted in the higher band for TDMA 1900, RF coupler apparatus 1200 exhibits isolation of about −54 dB, as shown by point 1500 in FIG. 15, and coupling of about −22 dB, as shown by point 1600 in FIG. 16, to yield a directivity of about −32 dB. RF coupler apparatus 1200, when coupling RF signals transmitted at the edges of the higher band for TDMA 1900, exhibits isolation of about −44 dB, as shown by point 1502 in FIG. 15, which along with coupling of about −22 dB yields a directivity of about −21 dB. As can be seen, when coupling RF signals transmitted in the higher band for TDMA 1900, the −32 dB and −21 dB directivities of RF coupling apparatus 1200 are much better than the −11 dB directivity of the previous embodiment of RF coupler apparatus 312.

The improved directivity of RF coupling apparatus 1200 is attributable to properly terminating the isolated port of through-path coupling element 321 when RF coupling apparatus 1200 is coupling RF signals transmitted in the higher band for TDMA 1900. Operation of the matching circuit 1202, is further described with reference to FIG. 17. The coupled port of coupled-path coupling element 319 has a complex impedance of 31+j16, as shown normalized at point 1700 in FIG. 17. Transmission line 1204 transforms the complex impedance of 31+j16 into a complex impedance of about 39+j44, as shown normalized at point 1701 in FIG. 17. Capacitor 1206 further transforms the complex impedance of about 39+j44 into a complex impedance of about 37−j44, as shown normalized at point 1702 in FIG. 17. Transmission line 1205 further transforms the complex impedance of about 37−j44 into a complex impedance of about 28−j2, as shown normalized at point 1703 in FIG. 17; thereby, providing a suitable termination impedance at the isolated port of coupled-path coupling element 321.

Alternate embodiments of the matching circuit 1202 can be used for impedance transformation. FIG. 18 shows an alternate matching circuit 1800 that employs only a single circuit element. In particular, alternate matching circuit 1800 employs a single discrete surface mount component, capacitor 1802. Capacitor 1802 is coupled in series between coupling elements 319 and 321. Assuming that frequency band TX BAND 1 is the lower of the two bands, such as the band associated with AMPS 800, and frequency band TX BAND 2 is the higher of the two bands, such as the band associated with TDMA 1900, an exemplary value for capacitor 1802 is 5.6 pF. Although shown to employ a single discrete surface mount component, alternate matching circuit 1800 may alternately use other single circuit element implementations, such as a single embedded transmission line coupled in series between coupling elements 319 and 321.

Figure 19:
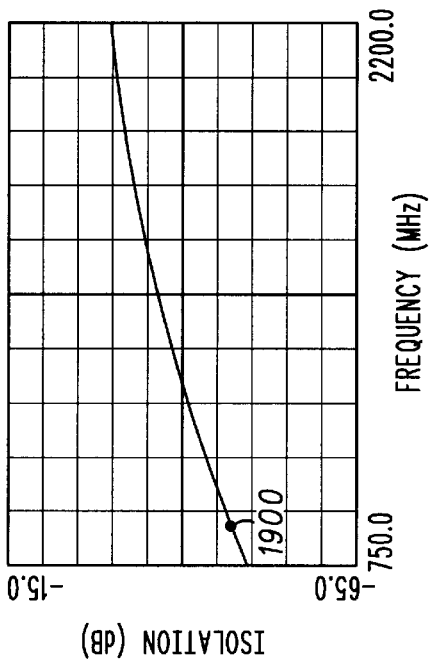
FIG. 19 is a graph illustrating isolation versus frequency for the RF coupler apparatus of FIG. 12 when using the matching circuit of FIG. 18 and coupling signals transmitted in the frequency band associated with AMPS 800.
Figure 20:
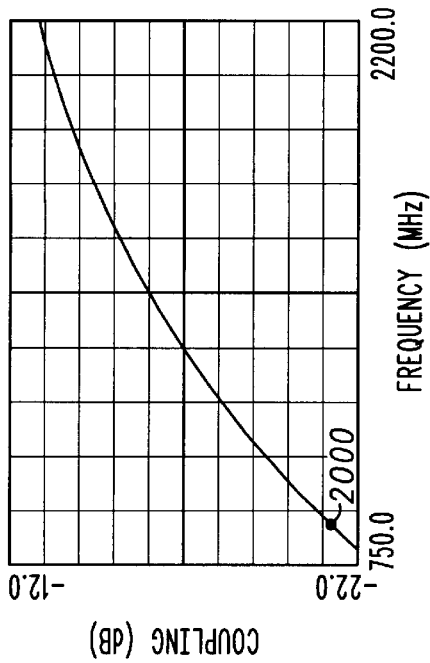
FIG. 20 is a graph illustrating coupling versus frequency for the RF coupler apparatus of FIG. 12 when using the matching circuit of FIG. 18 and coupling signals transmitted in the frequency band associated with AMPS 800.
Figure 21:
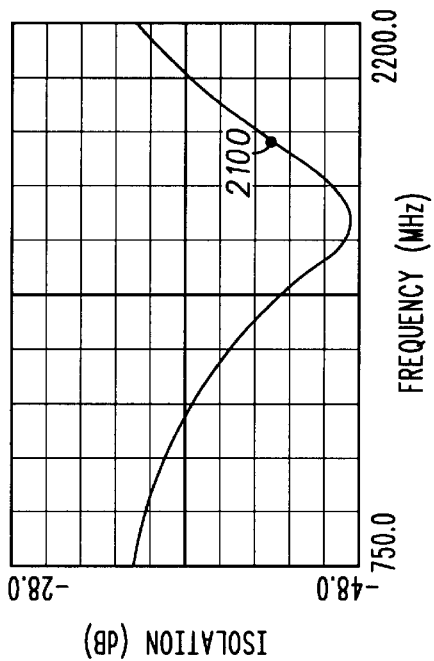
FIG. 21 is a graph illustrating isolation versus frequency for the RF coupler apparatus of FIG. 12 when using the matching circuit of FIG. 18 and coupling signals transmitted in the frequency band associated with TDMA 1900.
Figure 22:
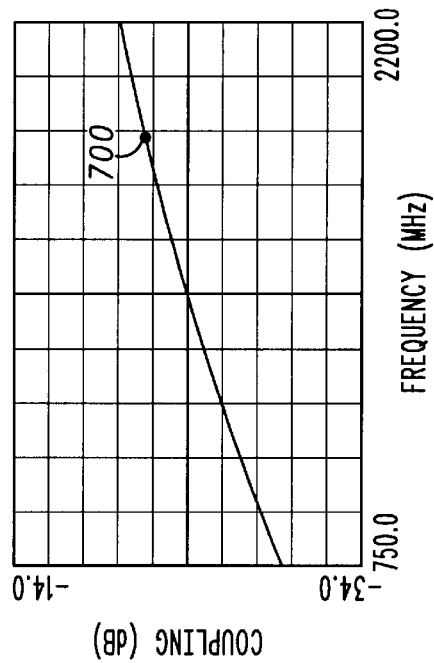
FIG. 22 is a graph illustrating coupling versus frequency for the RF coupler apparatus of FIG. 12 when using the matching circuit of FIG. 18 and coupling signals transmitted in the frequency band associated with TDMA 1900.
Figure 23:
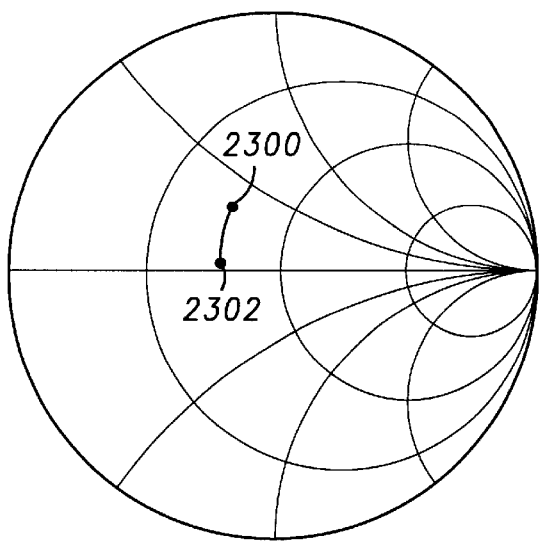
FIG. 23 is a Smith chart diagram illustrating impedance transformation performed by the matching circuit of FIG. 18 when used by the RF coupler apparatus of FIG. 12 during coupling of signals transmitted in the frequency band associated with TDMA 1900.
Figure 24:
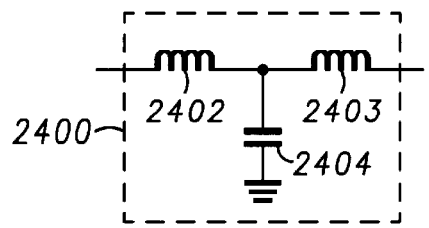
FIGS. 24–27 are schematic diagrams illustrating additional alternate embodiments of the matching circuit of FIG. 12, each employing multiple discrete surface mount components.
Figure 26:
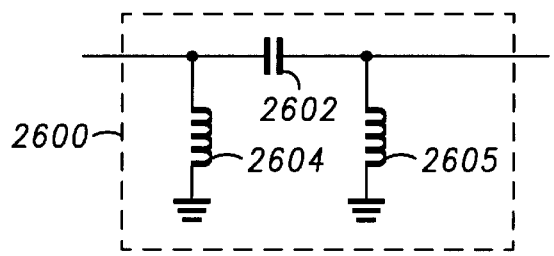
Figure 25:
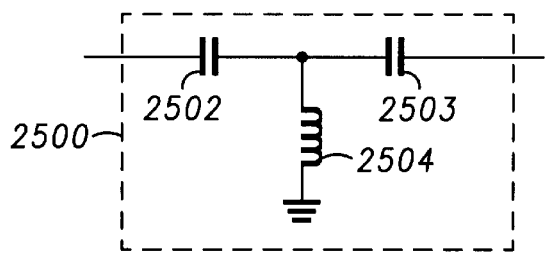
Figure 27:
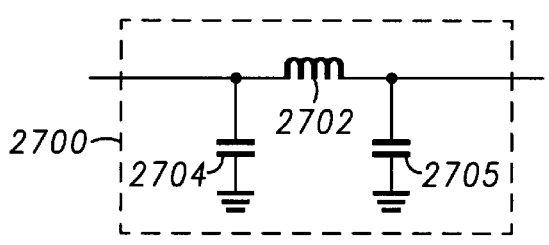

Using the exemplary value given for alternate matching circuit 1202 and the exemplary values for the couplers 314 and 315 and the termination device 316 described above in association with FIGS. 8–11, RF coupler apparatus 1200 operates in the following manner. When coupling RF signals transmitted in the lower band for AMPS 800, this embodiment of RF coupler apparatus 1200 exhibits isolation of about −47 dB, as shown by point 1900 in FIG. 19, and coupling of about −21 dB, as shown by point 2000 in FIG. 20, to yield directivity of about −26 dB. When coupling RF signals transmitted in the higher band for TDMA 1900, this embodiment of RF coupler apparatus 1200 exhibits isolation of about −43 dB, as shown by point 2100 in FIG. 21, and coupling of about −22 dB, as shown by point 2200 in FIG. 22, to yield a directivity of about −21 dB. When coupling RF signals transmitted in the higher band for TDMA 1900, this embodiment of RF coupling apparatus 1200 is further described with reference to FIG. 23. As previously specified, coupled-path coupling element 321 presents a complex impedance of about 31+j1 6, as shown normalized at point 2300 in FIG. 23. Capacitor 1802 transforms the complex impedance of about 31+j16 into a complex impedance of about 31+j1, as shown normalized at point 2302 in FIG. 23. Although the transformed complex impedance of 31+j1 does not exactly match the 27 ohm impedance of the termination device 316, there is sufficient termination at the isolated ports of coupled-path coupling elements 319 and 321 for this embodiment of RF coupler apparatus 1200 to have good directivity, as verified by FIGS. 19–22. However, alternate matching circuit 1800 does impose certain limitations on this embodiment of RF coupling apparatus 1200 including degraded directivity when coupling RF signals transmitted at the high edge of the band associated with TDMA 1900 as shown in FIG. 21.

Additional alternate matching circuits of FIGS. 24–27 employ only discrete surface mount components and avoid use of embedded elements, such as transmission lines, which often require many iterations of printed circuit board revisions for optimal tuning. Alternate matching circuit 2400 of FIG. 24 employs inductors 2402 and 2403, which are serially coupled between coupling elements 319 and 321; and a shunt capacitor 2404 coupled between the interconnection of inductors 2402 and 2403 and electrical ground. Alternate matching circuit 2500 of FIG. 25 employs capacitors 2502 and 2503, which are serially coupled between coupling elements 319 and 321; and a shunt inductor 2504 coupled between the interconnection of capacitors 2502 and 2503 and electrical ground. Alternate matching circuit 2600 of FIG. 26 employs capacitor 2602, which is serially coupled between coupling elements 319 and 321; shunt inductor 2604, which is coupled between coupling element 319 and electrical ground; and shunt inductor 2605, which is coupled between coupling element 321 and electrical ground. Alternate matching circuit 2700 of FIG. 27 employs inductor 2702, which is serially coupled between coupling elements 319 and 321; shunt capacitor 2704, which is coupled between coupling element 319 and electrical ground; and shunt capacitor 2705, which is coupled between coupling element 321 and electrical ground.

Figure 28:
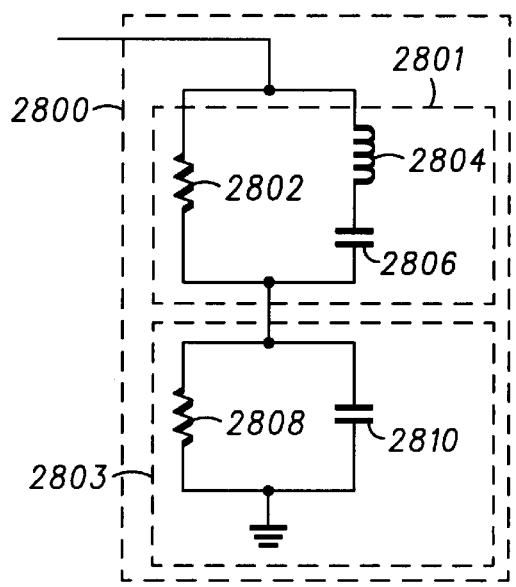

In some topologies, the printed circuit board may have limited space at the location where transmission lines 1204 and 1205 of the matching circuit 1202 of FIG. 12 are to be embedded. In such circumstances, transmission lines 1204 and 1205 that are embedded may lack the necessary physical length for the requisite impedance transformation. To compensate when the physical length of transmission lines 1204 or 1205 is too short, the termination device 316 of the RF coupler apparatus 1200 can employ alternate circuitry in the form of a multiple component termination network. In general, such alternate termination devices provide a complex impedance and include resonant circuits to provide optimal terminations when the communication device 200 of FIG. 2 is transmitting infrequency band TX BAND 1 or frequency band TX BAND 2. Alternate termination device 2800 is shown in FIG. 28. Alternate termination device 2800 includes upper and lower networks 2801 and 2803 coupled in series between the isolated port of coupled-path coupling element 319 and electrical ground. Upper network 2801 includes resistor 2802 and a series resonant circuit, which is made up of inductor 2804 and capacitor 2806, coupled in parallel to resistor 2802. Lower network 2803 includes resistor 2808 and capacitor 2810 coupled in parallel to resistor 2808. Inductor 2804 and capacitor 2806 are selected to have values such that the series resonant circuit is tuned to frequencies of interest in frequency band TX BAND 1. Resistor 2802 is selected to have an impedance optimized for best directivity of RF coupler apparatus 1200 when the communication device is transmitting in frequency band TX BAND 2. Capacitor 1206 of FIG. 12 is selected for final tuning of the impedance presented to RF coupler apparatus 1200 when the communication device is transmitting in frequency band TX BAND 2. Resistor 2808 and capacitor 2810 of lower network 2803 are selected to have an impedance optimized for best directivity of RF coupler apparatus 1200 when the communication device is transmitting in frequency band TX BAND 1. Assuming that-frequency band TX BAND 1 is the lower of the two bands, such as the band associated with AMPS 800, and frequency band TX BAND 2 is the higher of the two bands, such as the band associated with TDMA 1900, exemplary values for the termination device 2800 and matching circuit 1202 are as follows: resistor 2802 is 82 ohms; inductor 2804 is 10 nH; capacitor 2806 is 3.6 pF; resistor 2808 is 30 ohms; capacitor 2810 is 2 pF; transmission line 1204 has a length of 45 mils, a width of 7 mils and an impedance of 50 ohms; transmission line 1205 has a length of 170 mils, a width of 7 mils and an impedance of 50 ohms; and capacitor 1206 is 1.8 pF.

Figure 29:
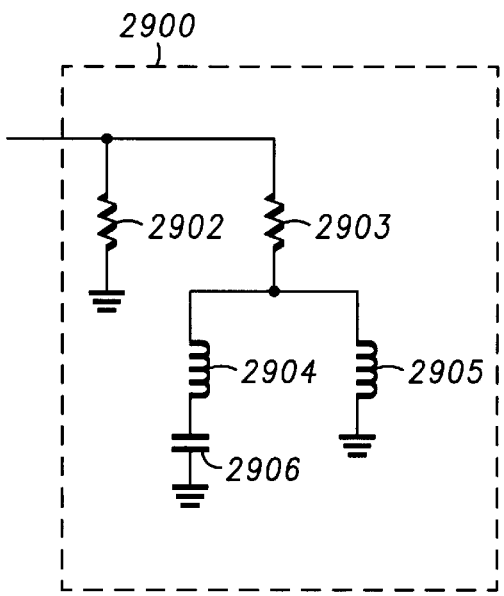
FIGS. 28–30 are schematic diagrams illustrating alternate embodiments of the termination device of FIG. 3.
Figure 30:
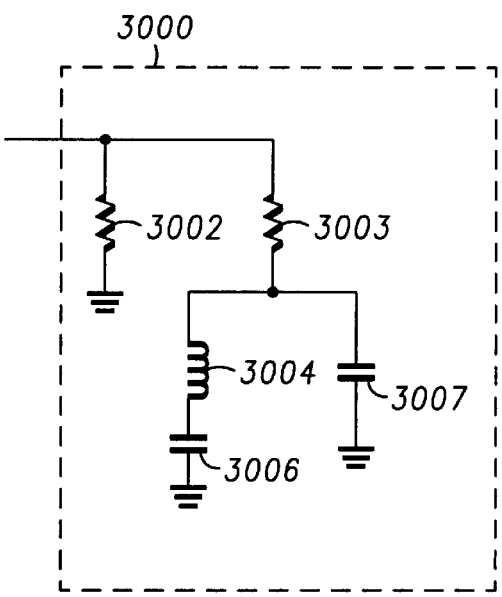

Other alternate multiple component termination networks for termination device 316 of FIG. 3 that compensates for the length of transmission lines 1204 and 1205 of FIG. 12 are shown in FIGS. 29 and 30 as alternate termination devices 2900 and 3000, respectively. Alternate termination device 2900 includes resistors 2902 and 2903, inductors 2904 and 2905 and capacitor 2906. Resistor 2902 is coupled in parallel to resistor 2903. Resistor 2903 is further coupled in series with inductor 2905, which is further coupled in parallel to a series resonant circuit made up of inductor 2904 and capacitor 2906. Alternate termination device 3000 includes resistor 3002 and 3003, inductor 3004 and capacitors 3006 and 3007. Resistor 3002 is coupled in parallel to resistor 3003. Resistor 3003 is further coupled in series with capacitor 3007, which is further coupled in parallel to a series resonant circuit made up of capacitor 3006 and inductor 3005.

Aside from compensating for the length of transmission lines 1204 and 1205 of FIG. 12, the alternate termination devices 2800, 2900 and 3000 of FIGS. 28, 29 and 30, respectively, also minimize development time and cost. The alternate termination devices 2800, 2900 and 3000 utilize discrete surface mount components having exposed contacts that can be readily probed during bench testing. The discrete surface mount components can be readily swapped to optimize circuit operation. On the other hand, embedded transmission lines can not be readily probed during bench testing and the dimensions of embedded transmission lines are fixed with the then current revision of the printed circuit board. As such, any changes or "tweaks" to embedded transmission lines must be done through a revision of the printed circuit board, which adds time and cost to the development process.

It will be further recognized that the impedance transformation performed by the matching circuit 1202 of FIG. 12 could alternately be performed solely by the termination device 316 of FIG. 3. In this embodiment, RF coupler apparatus 312 is employed; however, resistor 317 of the termination device 316 is replaced with alternate termination device 2800 of FIG. 28, 2900 of FIG. 29, 3000 of FIG. 30 or other suitable circuit arrangement that provides the proper port terminations and ensures good coupler directivity when the communication device 200 is transmitting in frequency band TX BAND 1 or in frequency band TX BAND 2.

When the communication device 200 is a device that transmits in more than two frequency bands, such as the tri-band or quad-band wireless telephone described above, RF coupler apparatus 312 of FIG. 3 may be readily extended to accommodate RF coupling in this device. RF coupler apparatus 312 may be extended to become RF coupler apparatus 3100 of FIG. 31 without departing from a single coupling structure having serially coupled couplers and compatibility with a RF power detector having a single detection diode. In order to transmit in more than two frequency bands, the transmitter 214 of the communication device 200 employs alternate transmitter circuitry 3101, shown in FIG. 31. The alternate transmitter circuitry 3101 defines a first transmit path having RF power amplifier 3102 and coupler 3106 for transmitting RF signals in frequency band TX BAND 1, a second transmit path having RF power amplifier 3103 and coupler 3107 for transmitting RF signals in frequency band TX BAND 2, a third transmit path having RF power amplifier 3104 and coupler 3108 for transmitting RF signals in frequency band TX BAND 3 and additional transmit paths, each having a RF power amplifier and a coupler, up to an Nth transmit path having RF power amplifier 3105 and coupler 3109 for transmitting in frequency band TX BAND N. The variable N is the maximum number of frequency bands within which the communication device 200 transmits. Coupled-path coupling elements 3110–3113 of couplers 3106–3109, respectively, are coupled in series to form a coupler chain. A termination device 3114, which is similar to the termination device 316 of FIG. 3, is coupled to the isolated port of coupled-path coupling element 3110. A RF power detector 3115, which is similar to the RF power detector 313, is coupled to the coupled port of coupled-path coupling element 3113. Optional matching circuits 3116, 3117 and 3118, similar to matching circuit 1202 of FIG. 12 or alternate matching circuits 1800, 2400, 2500, 2600 and 2700 of FIGS. 18, 24, 25, 26, and 27, respectively, may be coupled in series between couplers 3106–3109, respectively. More particularly, optional matching circuits 3116, 3117 and 3118 may be coupled between consecutive ones of coupled-path coupling elements, that is, between coupled-path coupling elements 3110 and 3111, between coupled-path coupling elements 3111 and 3112 and between coupled-path coupling elements 3112 and 3113, respectively. Termination device 3114 may include resistor 317 of FIG. 3, alternate termination device 2800 of FIG. 28, alternate termination device 2900 of FIG. 29 or alternate termination device 3000 of FIG. 30. Couplers 3106–3109, termination device 3114 and optional matching circuits 3116–3118 collectively form RF coupler apparatus 3100.

By merely varying the values of the aforementioned matching circuits and/or multiple component termination network, it is possible to compensate for a wide range of possible impedance mismatches presented to the RF coupler apparatus due to the particular mechanical or electrical structure of the couplers thereof. As such, it will be recognized that couplers 314 and 315 of RF coupler apparatus 1200 of FIG. 12, which are described above as preferably using broadside-coupled microstriplines, and couplers 3106–3109 of RF coupler apparatus 3100 of FIG. 31, which may preferably use broadside-coupled microstriplines, may alternately employ other electromagnetic coupling devices such as edge-coupled striplines, magnetic coupling devices such as those employing ferrite magnetic media, or any other device capable of generating a controlled amount of signal transfer from one transmission path to another transmission path.

Figure 31:
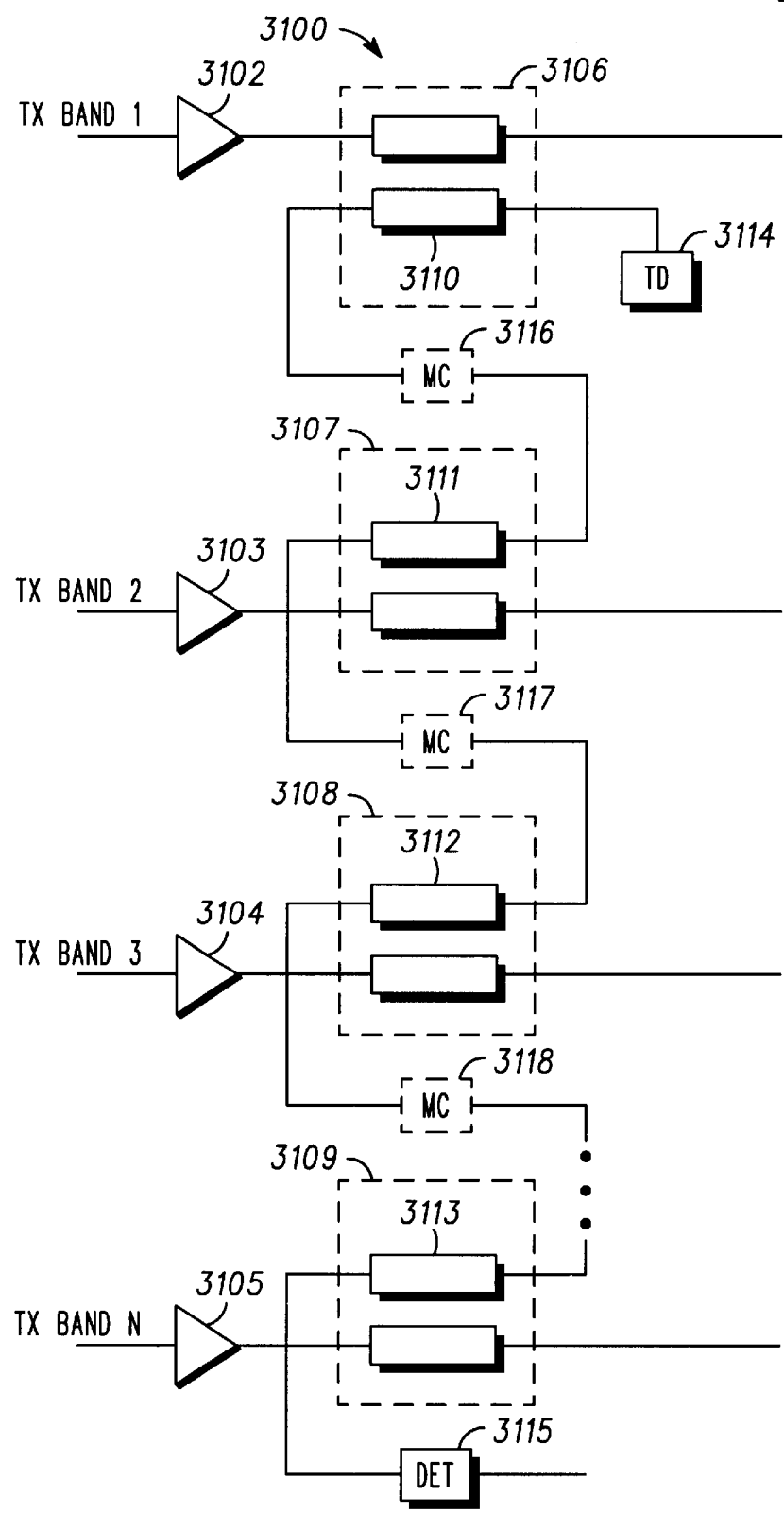
FIG. 31 is a schematic diagram illustrating alternate transmitter circuitry for the communication device of FIG. 2, the communication device being an N band wireless telephone, the alternate transmitter circuitry employing an alternate embodiment of the RF coupler apparatus of FIG. 3.

As described, one advantage of RF coupler apparatus 312 of FIG. 3, RF coupler apparatus 1200 of FIG. 12 and RF coupler apparatus 3100 of FIG. 31 is their compatibility with RF power detector 313 or 3115, which uses a single detection diode. A detection diode, as described above, is used for half wave rectifying of the coupled RF signal. It is well known in the art to employ an additional diode, aside from a detection diode, in a RF power detector for temperature compensation purposes. See for example, diode 212 in FIG. 2 of U.S. Pat. No. 4,523,155 to Walczak et al., entitled "Temperature Compensated Automatic Output Control Circuitry for RF Signal Power Amplifiers With Wide Dynamic Range," issued on Jun. 11, 1985 and assigned to Motorola, Inc., the assignee of the present application. Under no circumstances should the description of RF power detector 313 or RF power detector 3115 as using a single detection diode mitigate the advantage of using RF coupler apparatuses 312, 1200 and 3100 with other RF power detectors that employ a detection diode and additional diodes for temperature compensation or other purposes.

Thus it can be seen that a RF coupling apparatus employing a single coupling structure with serially coupled couplers is suited for use in a multi-band wireless telephone device and is compatible with a RF power detector employing a single detection diode. The directivity of the RF coupling apparatus can be further enhanced, particularly with respect to coupling RF signals transmitted in a high frequency band such as that associated with TDMA 1900, by adding a matching circuit and/or a multiple component termination network. While many particular embodiments have been shown and described, it will be recognized that further modifications may be made. It is therefore intended in the appended claims to cover all such changes and modifications which fall within the true spirit and scope of the invention.

What is claimed is:

1. A radio frequency (RF) coupler apparatus comprising:
a termination device;
a first coupler, the first coupler having first and second coupling elements, the first coupling element to pass a first RF signal having a frequency in a first frequency band, the second coupling element to couple the first RF signal passed by the first coupling element, the second coupling element coupled in series with the termination device; and
a second coupler, the second coupler having first and second coupling elements, the first coupling element of the second coupler to pass a second RF signal having a frequency in a second frequency band, the second coupling element of the second coupler to couple the second RF signal passed by the first coupling element of the second coupler, the second coupling element of the second coupler coupled in series with the second coupling element of the first coupler.

2. A RF coupler apparatus according to claim 1 further comprising a matching circuit coupled in series between the second coupling element of the first coupler and the second coupling element of the second coupler.

3. A RF coupler apparatus according to claim 2 wherein the second coupling element of the first coupler has first and second ports,
the termination device coupled to the first port of the second coupling element of the first coupler, and
the matching circuit comprises at least one transmission line having first and second ports, the first port of the at least one transmission line coupled to the second port of the second coupling element of the first coupler.

4. A RF coupler apparatus according to claim 3 wherein the second coupling element of the second coupler has first and second ports, and
the at least one transmission line comprises first and second transmission lines,
the first transmission line having first and second ports, the first port of the first transmission line coupled to the second port of the second coupling element of the first coupler, and
the second transmission line having first and second ports, the first port of the second transmission line coupled to the second port of the first transmission line, the second port of the second transmission line coupled to the first port of the second coupling element of the second coupler.

5. A RF coupler apparatus according to claim 3 wherein the termination device comprises only a single discrete component, the single discrete component being a resistor.

6. A RF coupler apparatus according to claim 3 wherein the termination device comprises a multiple component termination network.

7. A RF coupler apparatus according to claim 6 wherein the multiple component termination network comprises a circuit selected from the group consisting of:
a first circuit comprising first and second resistors, first and second capacitors and an inductor, the first resistor coupled in parallel to the first capacitor and the inductor, the second resistor coupled in parallel to the second capacitor,
a second circuit comprising first and second resistors, first and second inductors and a capacitor, the first resistor of the second circuit coupled in parallel to the second resistor of the second circuit, the second resistor of the second circuit coupled in series with the first inductor of the second circuit, the first inductor of the second circuit coupled in parallel to the second inductor of the second circuit and the capacitor of the second circuit, and
a third circuit comprising first and second resistors, first and second capacitors and an inductor, the first resistor of the third circuit coupled in parallel to the second resistor of the third circuit, the second resistor of the third circuit coupled in series with the first capacitor of the third circuit, the second capacitor of the third circuit coupled in parallel to the second capacitor of the third circuit and the inductor of the third circuit.

8. A RF coupler apparatus according to claim 2 wherein the matching circuit comprises only a single circuit element.

9. A RF coupler apparatus according to claim 8 wherein the single circuit element is a capacitor.

10. A RF coupler apparatus according to claim 2 wherein the matching circuit comprises only discrete surface mount components.

11. A RF coupler apparatus according to claim 10 wherein the matching circuit is a circuit selected from the group consisting of:

a first circuit comprising first and second inductors and a capacitor, the first inductor coupled in series with the second inductor, the capacitor coupled between the first and second inductors and electrical ground, a second circuit comprising first and second capacitors and an inductor, the first capacitor of the second circuit coupled in series with the second capacitor of the second circuit, the inductor of the second circuit coupled between the first and second capacitors of the second circuit and electrical ground, a third circuit comprising first and second inductors and a capacitor, the first inductor of the third circuit coupled between the capacitor of the third circuit and an electrical ground, the second inductor of the third circuit coupled between the capacitor of the third circuit and an electrical ground, and a fourth circuit comprising first and second capacitors and an inductor, the first capacitor of the fourth circuit coupled between the inductor of the fourth circuit and an electrical ground, the second capacitor of the fourth circuit coupled between the inductor of the fourth circuit and an electrical ground.

12. A RF coupler apparatus according to claim 1 wherein the termination device comprises a multiple component termination network.

13. A RF coupler apparatus according to claim 12 wherein the multiple component termination network comprises a circuit selected from the group consisting of:

a first circuit comprising first and second resistors, first and second capacitors and an inductor, the first resistor coupled in parallel to the first capacitor and the inductor, the second resistor coupled in parallel to the second capacitor, a second circuit comprising first and second resistors, first and second inductors and a capacitor, the first resistor of the second circuit coupled in parallel to the second resistor of the second circuit, the second resistor of the second circuit coupled in series with the first inductor of the second circuit, the first inductor of the second circuit coupled in parallel to the second inductor of the second circuit and the capacitor of the second circuit, and a third circuit comprising first and second resistors, first and second capacitors and an inductor, the first resistor of the third circuit coupled in parallel to the second resistor of the third circuit, the second resistor of the third circuit coupled in series with the first capacitor of the third circuit, the second capacitor of the third circuit coupled in parallel to the second capacitor of the third circuit and the inductor of the third circuit.

14. A wireless communication device for operating in multiple radio frequency (RF) bands, the wireless communication device comprising:

an antenna;

a receiver coupled to the antenna; and a transmitter coupled to the antenna, the transmitter comprising:

a first power amplifier for amplifying RF signals for transmission in a first band of the multiple frequency bands, the first power amplifier having an output;

a second power amplifier for amplifying RF signals for transmission in a second band of the multiple frequency bands, the second power amplifier having an output;

a termination device;

a first coupler coupled to the output of the first power amplifier, the first coupler coupled in series with the termination device;

a second coupler coupled to the output of the second power amplifier, the second coupler coupled in series with the first coupler; and a power detector coupled in series with the second coupler.

15. A wireless communication device according to claim 14 wherein the transmitter further comprises a matching circuit coupled in series between the first and second couplers.

16. A wireless communication device according to claim 14 wherein the power detector comprises only a single detection diode.

17. A wireless communication device according to claim 14 wherein the termination device comprises a multiple component termination network.

18. A wireless communication device according to claim 14 wherein the power detector comprises a detection diode, the first coupler comprises first and second coupling elements, the first coupling element to pass a first amplified RF signal having a frequency in the first band, the second coupling element to couple the first RF signal passed by the first coupling element, the second coupling element comprising first and second ports, the first port coupled in series with the termination device, and the second coupler comprises first and second coupling elements, the first coupling element of the second coupler to pass a second amplified RF signal having a frequency in the second band, the second coupling element of the second coupler to couple the second RF signal passed by the first coupling element of the second coupler, the second coupling element of the second coupler comprising first and second ports, the first port of the second coupling element of the second coupler coupled in series with the second port of the second coupling element of the first coupler, the second port of the second coupling element of the second coupler coupled in series with the detection diode of the power detector.

19. A wireless telephone for operating in multiple radio frequency (RF) frequency bands, the wireless telephone comprising:

an antenna;

a receiver coupled to the antenna; and a transmitter coupled to the antenna, the transmitter comprising:
   a plurality of RF power amplifiers comprising a RF power amplifier for each RF frequency band within which the wireless telephone transmits;
   a RF coupler apparatus comprising a plurality of couplers and a termination device, each of the plurality of couplers coupled to corresponding ones of the plurality of power amplifiers, each of the plurality of couplers having a though-path coupling element and a coupled-path coupling element, the coupled-path coupling element of all of the plurality of couplers joined in series to form a coupler chain, the termination device coupled in series to one end of the coupler chain; and
   a RF power detector coupled to the RF coupler apparatus, the RF power detector comprising a detection diode, the detection diode coupled in series to the other end of the coupler chain.

20. A wireless telephone according to claim 19 wherein the Rf coupler apparatus further comprises a plurality of matching circuits, each of the plurality of matching circuits coupled between consecutive ones of the coupled-path coupling element of the plurality of couplers.

* * * * *